(12) United States Patent
Bamesberger

(10) Patent No.: US 11,198,235 B2
(45) Date of Patent: Dec. 14, 2021

(54) FLEXIBLE MASK MODULATION FOR CONTROLLING ATMOSPHERE BETWEEN MASK AND SUBSTRATE AND METHODS OF USING THE SAME

(71) Applicant: CANON KABUSHIKI KAISHA, Tokyo (JP)

(72) Inventor: Seth J. Bamesberger, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 223 days.

(21) Appl. No.: 16/059,140

(22) Filed: Aug. 9, 2018

(65) Prior Publication Data

US 2020/0047379 A1    Feb. 13, 2020

(51) Int. Cl.
| | |
|---|---|
| *B29C 43/02* | (2006.01) |
| *B29C 43/00* | (2006.01) |
| *B29C 43/56* | (2006.01) |
| *G03F 7/00* | (2006.01) |
| *B29C 43/14* | (2006.01) |
| *G03F 7/20* | (2006.01) |
| *B82Y 10/00* | (2011.01) |
| *B82Y 40/00* | (2011.01) |

(52) U.S. Cl.
CPC .......... *B29C 43/021* (2013.01); *B29C 43/003* (2013.01); *B29C 43/56* (2013.01); *G03F 7/0002* (2013.01); *G03F 7/703* (2013.01); *B29C 2043/025* (2013.01); *B29C 2043/142* (2013.01); *B29C 2043/566* (2013.01); *B82Y 10/00* (2013.01); *B82Y 40/00* (2013.01)

(58) Field of Classification Search
CPC ..... B29C 59/02; B29C 59/022; B29C 59/023; G03F 7/0002; G03F 7/703
See application file for complete search history.

(56) References Cited

U.S. PATENT DOCUMENTS

| | | |
|---|---|---|
| 7,670,534 B2 | 3/2010 | Choi et al. |
| 8,913,230 B2 | 12/2014 | GanapathiSubramanian et al. |
| 2010/0072652 A1* | 3/2010 | GanapathiSubramanian ............. B82Y 10/00 264/101 |

FOREIGN PATENT DOCUMENTS

| | | |
|---|---|---|
| JP | 2012099789 A | 5/2012 |
| JP | 2013162045 A | 8/2013 |
| JP | 2014065215 A | 4/2014 |
| JP | 2014069339 A | 4/2014 |

* cited by examiner

*Primary Examiner* — Joseph S Del Sole
*Assistant Examiner* — Mohamed K Ahmed Ali
(74) *Attorney, Agent, or Firm* — Abel Schillinger, LLP

(57) ABSTRACT

An apparatus may include a substrate holder configured to hold a substrate. The substrate holder may include a first chucking region having a first area and an adjacent region extending from the chucking region. The apparatus may also include a superstrate holder configured to hold a superstrate. The superstrate holder may include a second chucking region having a second area. The second area may be larger than the first area and the superstrate holder faces the substrate holder forming a first gap between the adjacent region surface and the superstrate and a second gap between the substrate and the superstrate. The apparatus may also include a gas supply system between the first gap and the second gap. The superstrate holder may alter a shape of the held superstrate to decrease the first gap and increase the second gap.

9 Claims, 4 Drawing Sheets

FLEXIBLE MASK MODULATION FOR CONTROLLING ATMOSPHERE BETWEEN MASK AND SUBSTRATE AND METHODS OF USING THE SAME

FIELD OF THE DISCLOSURE

The present disclosure relates to substrate processing, and more particularly to planarization of surfaces in semiconductor fabrication.

RELATED ART

Planarization techniques are useful in fabricating electronic devices on semiconductor wafers. Such techniques can include the use of fluid dispense systems for depositing a formable material onto the wafer. A superstrate planarizes and/or patterns the dispensed material before the dispensed material is solidified on the wafer.

However, defects, such as non-fill defects, can arise as the superstrate makes contact with the dispense material on the substrate. Improvements in planarization techniques are desired to allow for whole wafer processing.

SUMMARY

In an aspect, an apparatus may include a substrate holder configured to hold a substrate. The substrate holder may include a first chucking region having a first area and an adjacent region extending from the chucking region. The apparatus may also include a superstrate holder configured to hold a superstrate. The superstrate holder may include a second chucking region having a second area. The second area may be larger than the first area and the superstrate holder faces the substrate holder forming a first gap between the adjacent region surface and the superstrate and a second gap between the substrate and the superstrate. The apparatus may also include a gas supply system between the first gap and the second gap. The superstrate holder may alter a shape of the held superstrate to decrease the first gap and increase the second gap.

In another aspect, the gas supply system can be within the adjacent region of the substrate holder.

In another aspect, the adjacent region may circumferentially surround the first chucking region and may include at least one recessed portion configured to direct the flow of gas away from the substrate.

In yet another aspect, an edge of the superstrate may be closer to the adjacent region than the center of the superstrate.

In another aspect, the superstrate holder alters the shape of the held superstrate convexly.

In a further aspect, the superstrate holder alters the shape of the held superstrate in a wave form.

In another aspect, the first gap is farther from a center of the substrate than the second gap.

In another aspect, the gas supply system may include a plurality of ports, and the plurality of ports may be between an edge of the adjacent region and the first chucking region.

In another aspect, a method for planarization may include positioning a superstrate a first distance from a surface of a substrate. The substrate may be held on a substrate holder. The substrate holder may include a surface region extending from the held substrate. The method for planarization may also include modulating a shape of the superstrate to create a flow resistance of a gas between a first gap and a second gap. The first gap may have a first distance between the superstrate and the surface region of the substrate holder, the second gap may have a second distance between the superstrate and the surface of the substrate, and the second distance may be greater than the first distance. The method for planarization may also include flowing a gas into a region between the first gap and the second gap. The gas may flow between the surface of the substrate and the superstrate.

In another aspect, the second gap may be closer to the center of the substrate than the first gap.

In another aspect, the distance of the first gap may retain the introduced gas between the surface of the substrate and the superstrate.

In another aspect, the method for planarization may further include moving at least a portion of the superstrate to decrease the first distance of the first gap while flowing the gas into the region between the first gap and the second gap.

In another aspect, the method for planarization may further include after introducing the gas between the surface of the substrate and the superstrate, further modulating the shape of the superstrate to increase the first distance of the first gap and decrease the second distance of the second gap, and then lowering the superstrate to contact a formable material deposited on the surface of the substrate.

In another aspect, the second distance may be twice the first distance.

In another aspect, the method for planarization may further include removing a second gas through at least one slot in the surface region of the substrate holder adjacent to the substrate.

In another aspect, modulating the shape of the superstrate to create a flow resistance may include bending the superstrate in a convex form.

In another aspect, modulating the shape of the superstrate to create a flow resistance may include bending the superstrate in a wave form.

In another aspect, a method of manufacturing an article may include dispensing a formable material on a substrate. The substrate may be held on a substrate holder. The substrate holder may have a surface region extending from the held substrate. The method of manufacturing an article may also include modulating a shape of a superstrate to create a flow resistance of a gas between a first gap and a second gap. The first gap may have a first distance between the superstrate and the surface region of the substrate holder and the second gap may have a second distance between the superstrate and the surface of the substrate, and the second distance may be greater than the first distance. The method of manufacturing an article may also include flowing a gas into a region between the first gap and the second gap. The gas may flow between the surface of the substrate and the superstrate. The method of manufacturing an article may also include modulating the shape of the superstrate such that the first distance of the first gap may be greater than the second distance of the second gap, contacting the formable material with the superstrate, and curing the formable material to form a planar layer on the substrate.

In another aspect, the article may include an electronic device, and the substrate may include a semiconductor wafer.

In another aspect, the patterned substrate may have a nonplanar surface when dispensing the formable material.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

Figure 1:
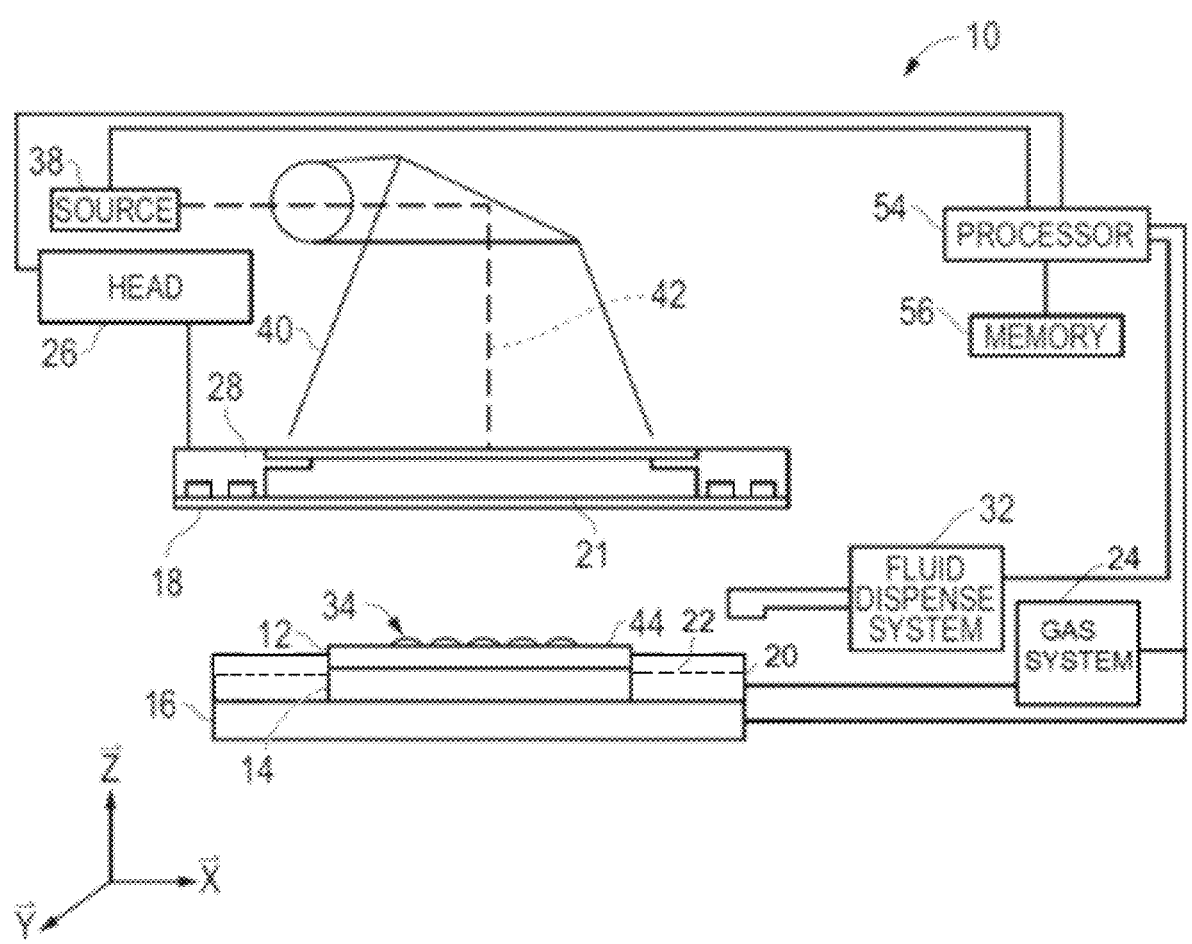
FIG. 1 includes an illustration of a side view of an exemplary imprint lithography system.
Figure 7:
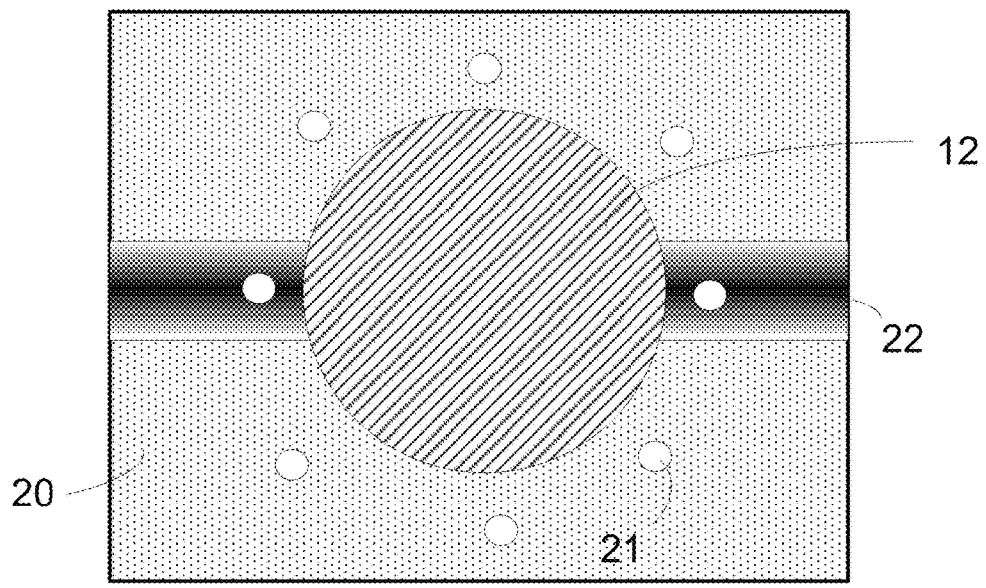
FIG. 7 includes an illustration of a top view of an adjacent region, according to one embodiment.

Referring to FIG. 1, an apparatus 10 in accordance with an embodiment described herein can be used in controlling the environment over a substrate 12 in preparation for planarization. The substrate 12 may be a semiconductor base material, such as a silicon wafer, but may include an insulating base material, such as glass, sapphire, spinel, or the like. The substrate 12 may be coupled to a substrate holder 14. The substrate holder 14 may be a vacuum chuck; however, in other embodiments the substrate holder 14 may be any chuck including vacuum, pin-type, groove-type, electrostatic, electromagnetic, or the like. The substrate 12 and substrate holder 14 may be further supported by a stage 16. The stage 16 may provide translating or rotational motion along the X-, Y-, or Z-directions. The substrate 12 and the substrate holder 14 may be circumferentially surrounded by an adjacent region 20. In one embodiment, the adjacent region 20 may be a singular piece that is a part of the substrate holder 14. In another embodiment, the adjacent region 20 may be a separate piece apart from the substrate holder 14. The adjacent region 20 may be rectangular, circular, hexagonal, or any other geometric shape. In one embodiment, the adjacent region 20 may include at least one recess 22 (FIG. 7). In one embodiment, at least one recess 22 extends from an inner edge adjacent the substrate 12 and substrate holder 14 to an outer edge opposite the inner edge. The stage 16, substrate 12, substrate holder 14, and adjacent region 20 may also be positioned on a base (not illustrated).

Spaced-apart from the substrate 12 may be a superstrate 18. Among other things, superstrate 18 can be used in controlling an atmosphere around the substrate 12. The superstrate 18 can be coupled to a superstrate holder 28. The superstrate 18 may be both held by and its shape modulated by the superstrate holder 28. In one embodiment, the superstrate holder 28 may include a pressure system 60 to aid in holding and modulating the superstrate 18. The superstrate holder 28 may be configured to hold a superstrate 18 within a chucking region 70. The superstrate holder 28 can be configured as vacuum, pin-type, groove-type, electrostatic, electromagnetic, or another similar holder type. In an embodiment, the superstrate holder 28 may be coupled to an imprint head 26 such that the superstrate holder 28 or imprint head 26 can facilitate translation or rotational motion of the superstrate 18 along the X-, Y-, or Z-directions. The pressure system 60 may be coupled to the superstrate holder 28 to facilitate shape modification of the superstrate 18. In one embodiment, the pressure system 60 can be used to modulate the shape of superstrate 18 by applying pressure, either positive or vacuum, to various zones of holder 28 in order to modulate the shape of the superstrate 18. In one embodiment, the pressure system 60 applies a combination of both positive pressure and vacuum to the various zones of the superstrate holder 28.

In one embodiment, the superstrate 18 can have a surface area that is larger than the substrate 12, substrate holder 14, and adjacent region 20. In another embodiment, the superstrate can have a surface area that is larger than the substrate 12. In one embodiment, the chucking area of the superstrate holder 28 can be larger than the chucking area of the substrate holder 14. For example, for a 300 mm diameter substrate 12, the superstrate may have a 450 mm-600 mm diameter. In one embodiment, the superstrate 18 may have a diameter twice the diameter of the substrate 12. In one embodiment, the superstrate 18 may have a diameter at least 5% larger than the diameter of the substrate 12 or at least 10% or at least 20% or at least 25% or at least 40% or at least 50% larger than the diameter of the substrate 12.

In one embodiment, the superstrate 18 can include a body. The body can include a glass-based material, silicon, an organic polymer, a siloxane polymer, a fluorocarbon polymer, a sapphire, a spinel, another similar material, or any combination thereof. The glass-based material can include soda lime glass, borosilicate glass, alkali-barium silicate glass, aluminosilicate glass, quartz, synthetic fused-silica, or the like. The superstrate 18 can include a deposited oxide, anodized alumina, an organo-silane, an organosilicate material, an organic polymer, inorganic polymers, and any combination thereof. The body can have a thickness in a range of 30 microns to 2000 microns.

The apparatus 10 can further include a purge gas system 24 used to supply the purge gas, such as helium, between the substrate 12 and superstrate 18. In one embodiment, the purge gas system may be connected to the adjacent region 20. In another embodiment, the purge gas system 24 may include various conduits 21 to supply the purge gas between the substrate 12 and the superstrate 18. In one embodiment, the various conduits 21 may be within the adjacent region 20 and may have an opening within the adjacent region. In an embodiment, the purge gas may be helium. The apparatus 10 may further include a fluid dispense system 32 used to deposit a planarization precursor material 34 on a first surface 44 of the substrate 12. For example, the planarization precursor material 34 may include a polymerizable material, such as a resin. The planarization precursor material 34 may be positioned on the substrate 12 in one or more layers using techniques such as droplet dispense, spin-coating, dip coating, extrusion coating, or combinations thereof. The planarization precursor material 34 may be dispensed upon the substrate 12 before a desired volume is defined between a superstrate 18 and the substrate 12. In one embodiment, the planarization precursor material 34 may include a monomer mixture that can be cured using ultraviolet light, heat, or the like.

The apparatus 10 may further include an energy source 38 coupled to a direct energy 40 along a path 42. The head 26 and stage 16 can be configured to position the superstrate 18 and substrate 12 in superimposition with the path 42. The apparatus 10 may be regulated by a logic element 54 in communication with the stage 16, the purge gas system 24, head 26, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Figure 2:
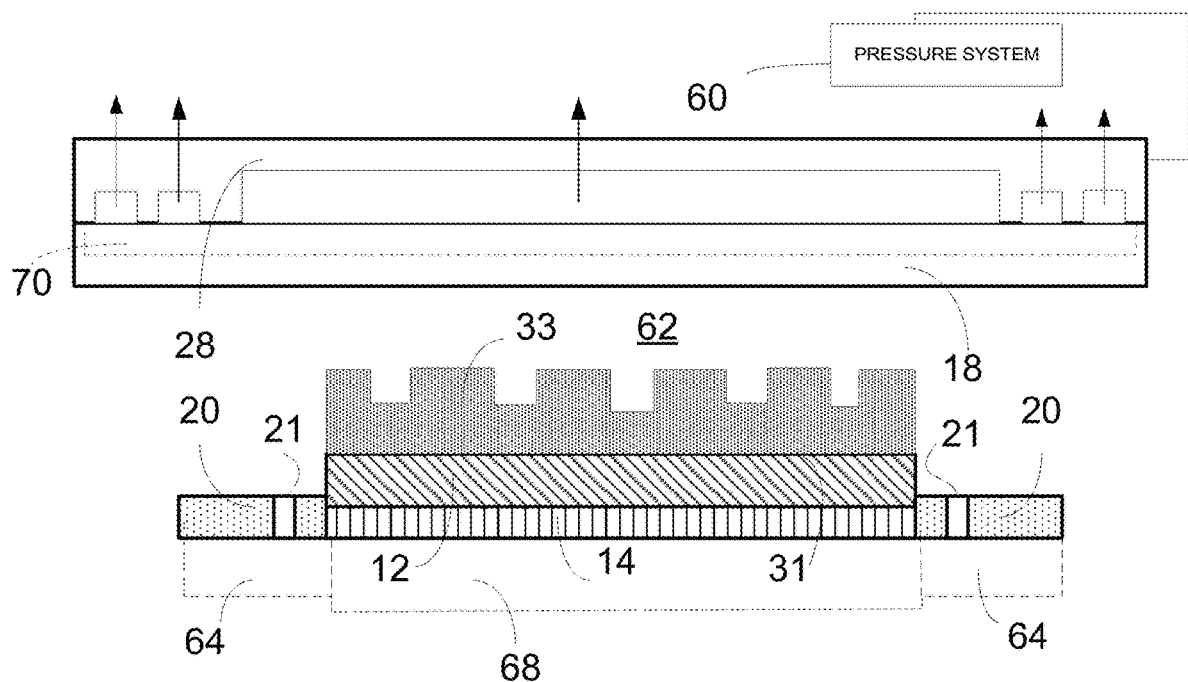
FIG. 2 includes an illustration of a cross-sectional view of a device substrate having a varying topography and a superstrate in accordance with an embodiment after forming a patterned layer.

FIGS. 2 to 5 illustrate a process in which the superstrate 18 may be used in controlling the environment over a substrate 12 in preparation for planarization in a lithographic system. The features in FIGS. 2 to 5 are exaggerated to simplify understanding. FIG. 2 include a cross-sectional view of a substrate 12, such as a semiconductor wafer, having a surface 31, and a patterned layer 33 on the surface 31 of the substrate 12. The patterned layer 33 can be a previously formed device layer or a resist layer.

As can be seen in FIG. 2, the patterned layer 33 may not be perfectly flat and may vary across the surface 31. Variations in the surface 31 topography of the patterned layer 33 may be due to variations in planarity of the substrate 12 before patterning begins or could be due to variations in deposition and patterning during the manufacturing process. By performing a planarization process, either cause of non-planarity is mitigated, thereby reducing defects and increasing uniformity in the final stack. Further to FIG. 2, the substrate holder 14 may include a chucking region 68 configured to chuck the substrate 12 and an adjacent region 64 with a surface extending beyond the chucking region 68. In one embodiment, the chucking region 70 of the superstrate holder 28 may be larger than the chucking region 68 of the substrate holder 14.

Figure 3:
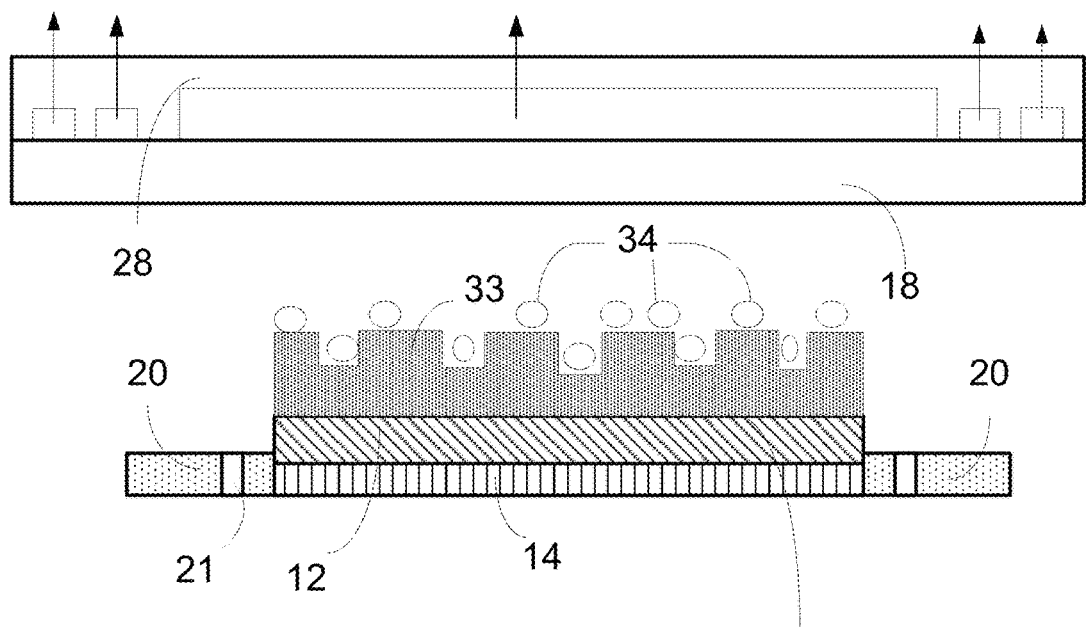
FIG. 3 includes an illustration of a cross-sectional view of the substrate and the superstrate of FIG. 2 after dispensing a planarization precursor material.

Referring to FIGS. 1 and 3, the planarization precursor material 34 may be formed over the patterned layer 33 using the apparatus 10. When using a droplet dispense method for the planarization precursor material 34, the substrate 12 and fluid dispense ports of the fluid dispense system 32 move relative to each other while dispensing fluid droplets of the planarization precursor material 34 on patterned layer 33 with a fluid droplet pattern. After planarization precursor material 34 is deposited over the patterned layer 33, it may be desirable to control the atmosphere 62 between the substrate 12 and superstrate 18. Controlling the atmosphere 62 between superstrate and substrate can avoid the deleterious effects of gases and/or gas pockets forming in planarization precursor material 34 and/or being subsequently trapped in the formed layer or between the formed layer and the superstrate. For example, a purge gas, such as e.g., helium, can replace gases, e.g., atmospheric air. As the superstrate contacts the formable material, trapped air between the superstrate and the formable material can lead to non-fill defects. However, a purge gas having smaller molecules than the atmospheric air—such as He—is able to dissipate through the glass superstrate more readily than the larger molecules found in the atmospheric air, i.e., N2 or O2. Thus, by controlling the atmosphere, gas trapping and resulting non-fill defects can be mitigated.

Figure 4:
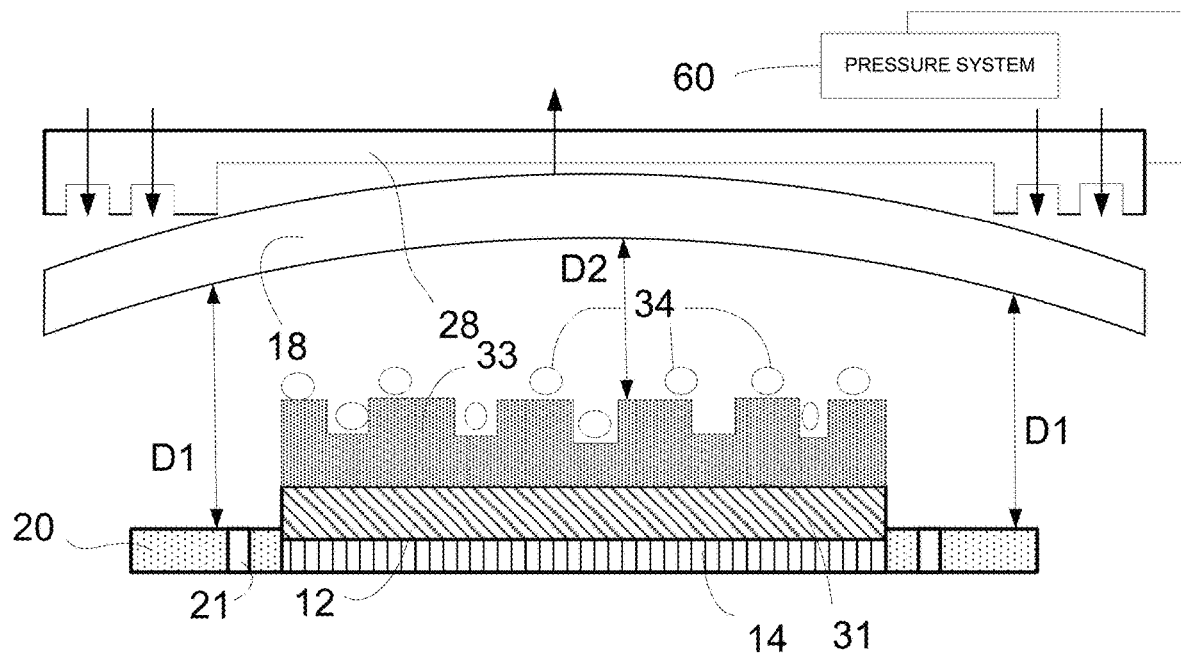
FIG. 4 includes an illustration of a cross-sectional view of the substrate and the superstrate of FIG. 3 as the superstrate is modulated in accordance with an embodiment.

To facilitate such atmospheric control, and more particularly to facilitate the flow of a purge gas into the atmosphere or region between the superstrate 18 and superstrate 12, the shape of superstrate 18 itself can be modulated to create a resistance to gas flow away from the region 62. Referring to FIGS. 1, 4, 5, and 6, the superstrate holder 28 may modulate the shape of superstrate 18 to form a first gap D1 between the adjacent region 20 and the superstrate 18 during a first period of time and a second gap D2 between the substrate 12 and the superstrate 18. When D1 is less than D2 there is a greater resistance to gas flow between superstrate 18 and substrate 12 at gap D1 and less resistance of gas flow towards the area of gap D2. This facilitates both filling and maintaining the gap D2 region or atmosphere with e.g. a purge gas. In one embodiment, the superstrate holder 28 may modulate the superstrate 18 in a convex form facing the substrate 12 (FIG. 4). In one embodiment, the pressure system 60 applies no pressure or positive pressure to the superstrate 18 in one zone and vacuum pressure in a different zone, as indicated by the arrows. In one embodiment of FIG. 4, as the superstrate holder 28 modulates the superstrate 18, the first gap D1 may decrease while the second gap D2 may increase. In another embodiment, the superstrate holder 28 may modulate the superstrate 18 in a wave pattern facing the substrate 12 (FIG. 6). In one embodiment, the pressure system 60, applies vacuum pressure in a first zone, vacuum pressure in a second zone, and positive pressure in a third zone, where the third zone is in between the first zone and the second zone. In one embodiment, the second gap D2 may have a distance that may be twice the distance of the first gap D1. In another embodiment, the second gap D2 may be closer to a center of the substrate 12 than D1. For a given gas flow and atmosphere volume, the first gap D1 distance can be selected to achieve a desired flow resistance. In one embodiment, the first gap D1 may be at least 1 micron or 5 microns or 10 microns or 20 microns or 40 microns or 50 microns. In one embodiment, the first gap D1 may not be greater than 500 microns or no greater than 450 microns or no greater than 300 microns or no greater than 100 microns. In one embodiment, the second gap D2 may be at least 0.8 mm or 1 mm or 1.5 mm. In one embodiment, the second gap D2 may not be greater than 3, or 2.5 mm or 2 mm or 1.8 mm.

The superstrate holder 28 may hold the superstrate 18 in a modulated position during a second period of time in which the gas supply system 24 flows purging gas in between the first gap D1 and the second gap D2. In other words, the changing shape of superstrate 18, as affected by the superstrate holder 28, may decrease the distance of D1 and increase the distance of D2 facilitating the flow of gas towards D2 and restricting the flow of gas outside D1. In one embodiment, the gas supply system 24 may flow purging gas for between 1-20 seconds. In one embodiment, the purging gas may be helium. In another embodiment, the purging gas may be a gas selected from a group of gases including helium, hydrogen, nitrogen, carbon dioxide, and xenon. The purging gas may be introduced between the first gap D1 and the second gap D2 through one or more conduits 21 in the adjacent region 20. In one embodiment, the one or more conduits 21 may be circumferentially surrounding the substrate 12. In another embodiment, the one or more conduits 21 may be in a dispersed pattern within the adjacent region 20. In yet another embodiment, the one or more conduits 21 may be between the first gap D1 and the second gap D2.

Without modulation, the first gap D1 would be greater than the second gap D2 and the gas system would have more difficulty flowing and maintaining a purge gas about the center of the substrate 12. However, as the pressure system 30, including the superstrate holder 28, modulates and holds the superstrate 18 in a deformed position, the superstrate 18 affects the purge gas flow dynamics of the environment between the substrate 12/adjacent region 20 and superstrate 18 providing for the purging gas to flow faster towards the center of the substrate 12 near the second gap D2. Additionally, by decreasing the first gap D1, the superstrate holder 28 facilitates and maintains the atmosphere between the first gap D1 and the second gap D2 by restricting the flow of the purge gas such that the purge gas fills and remains constrained within the area between the superstrate 18 and the substrate 12. In a further embodiment, the superstrate holder 28 modulates a region about the center of the holder upwards, away from the substrate 12, creating a localized vacuum to further facilitate the ingress of purging gas into the area between the superstrate 18 and the substrate 12.

Additionally, by modulating the superstrate 18, the gas supply system 24 can use a reduced amount of purging gas between the superstrate 18 and the substrate 12. As the gas supply system 24 flows purge gas towards the second gap D2, gases already in the system, i.e. ambient and/or purge gases, may flow through the adjacent region 20 away from the substrate 12. In one embodiment, as the gas supply system 24 flows purge gas towards the second gap D2, ambient gases may flow through the adjacent region 20 away from the substrate 12. In one embodiment, the adjacent region 20 may circumferentially surround the substrate holder 16. In one embodiment, the recessed portion 22 may extend from an inner surface adjacent the substrate holder 16 to an outer edge. In one embodiment, the adjacent region 20 may have at least one recessed portion 22 configured to direct the flow of gas away from the substrate 12. The adjacent region 20 may be a separate piece from or one continuous piece of the substrate holder 16.

Figure 5:
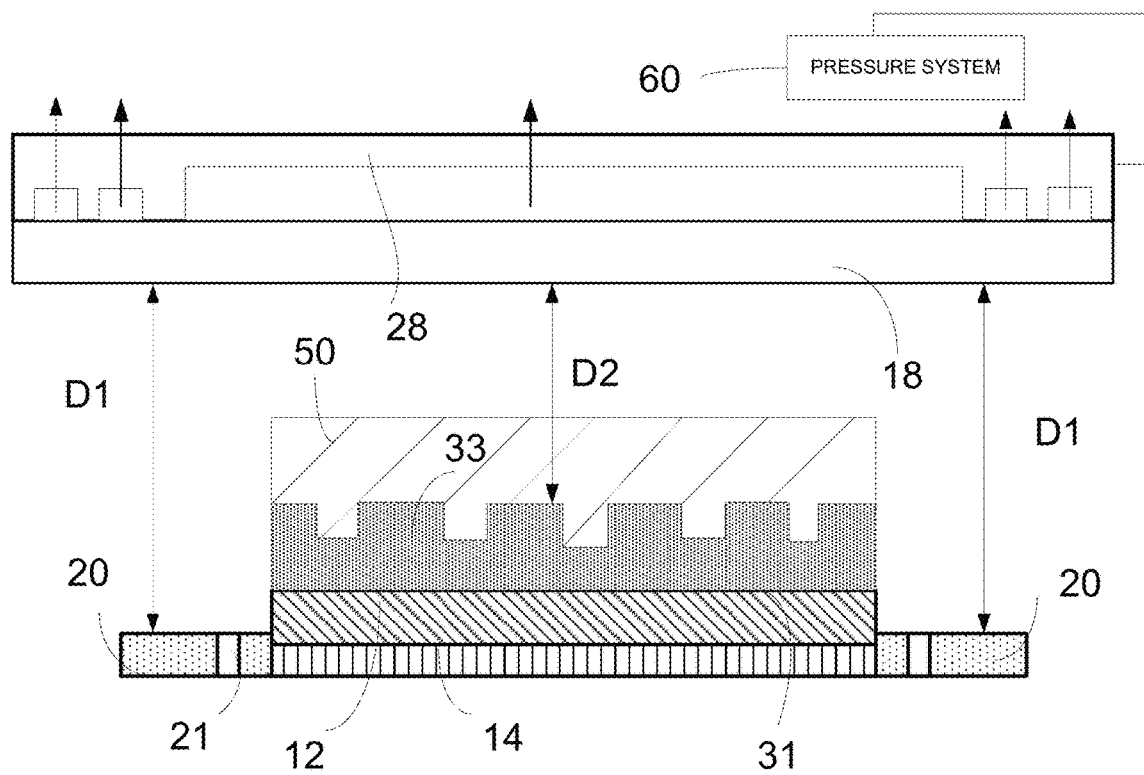
FIG. 5 includes an illustration of a cross-sectional view of the substrate, the patterned layer, and the superstrate of FIG. 4 after forming a planarization layer.
Figure 6:
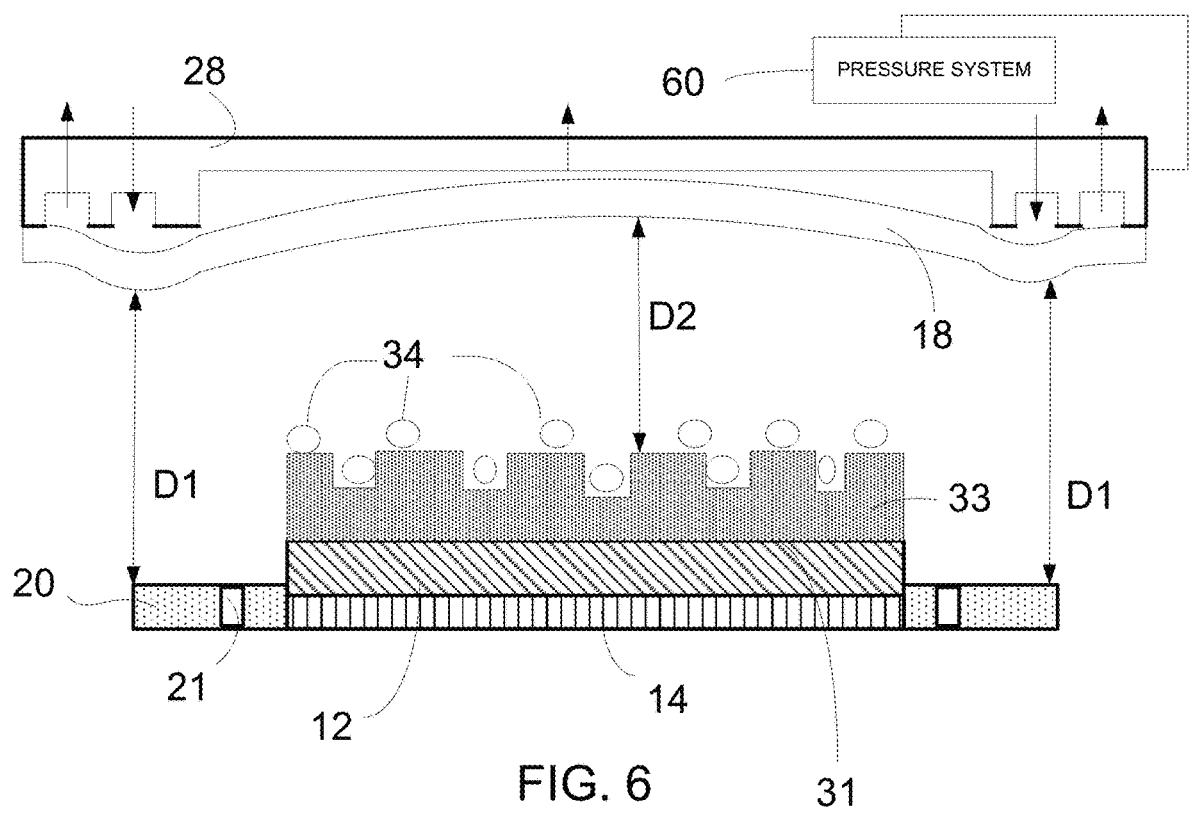
FIG. 6 includes an illustration of a cross-sectional view of the substrate and the superstrate of FIG. 3 as the superstrate is modulated in accordance with another embodiment.

Referring to FIGS. 1 and 5, after flowing a purging gas between the substrate 12 and the superstrate 18, the superstrate holder 28 may modulate the superstrate 18 such that the superstrate 18 is substantially flat or planar. In another embodiment, after flowing a purging gas between the substrate 12 and the superstrate 18, the superstrate holder 28 may modulate the superstrate 18 such that the superstrate 18 is concave. In one embodiment, the second gap D2 may be less than the first gap D1 during a third period of time. The superstrate 18 can be brought into contact with the planarization precursor material 34, and the planarization precursor material 34 spreads and fills the space between the superstrate 18 and the patterned layer 33. The planarization precursor material 34 may be cured (e.g., photocuring or thermally) to form the planarization layer 50 (FIG. 5). After the planarization layer 50 is formed, the superstrate 18 may be separated from the substrate 12 and patterned layer 33.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An apparatus comprising:
    a substrate holder configured to hold a substrate, the substrate holder comprising:
    a first chucking region having a first area; and
    an adjacent region extending laterally from the first chucking region, wherein a surface of the adjacent region is on a different plane than a surface of the first chucking region, wherein the adjacent region comprises a top surface with one or more conduit openings;
    a stage configured to hold the substrate holder;
    a superstrate holder configured to hold a superstrate, the superstrate holder comprising a second chucking region having a second area, wherein the second area is larger than the first area, and wherein the superstrate holder faces the substrate holder forming a first gap between the adjacent region surface and the superstrate and a second gap between the substrate and the superstrate; and
    a gas supply system configured to supply a gas within the first gap and the second gap through the one or more conduit openings, wherein the superstrate holder alters a shape of the held superstrate to decrease the first gap and increase the second gap, wherein after the superstrate is adjusted into a first shape so that the second gap is larger than the first gap, the superstrate is configured to be adjusted into a second shape so that the second gap is smaller than the first gap before the superstrate is brought in contact with a formable material on the substrate.

2. The apparatus of claim 1, wherein the gas supply system is within the adjacent region of the substrate holder.

3. The apparatus of claim 2, wherein the adjacent region circumferentially surrounds the first chucking region and comprises at least one recessed portion configured to direct the flow of gas away from the substrate.

4. The apparatus of claim 1, wherein an edge of the superstrate is closer to the adjacent region than the center of the superstrate.

5. The apparatus of claim 4, wherein the superstrate holder alters the shape of the held superstrate convexly.

6. The apparatus of claim 4, wherein the superstrate holder alters the shape of the held superstrate in a wave form.

7. The apparatus of claim 1, wherein the first gap is farther from a center of the substrate than the second gap.

8. The apparatus of claim 1, wherein the gas supply system comprises a plurality of ports, and wherein the plurality of ports are between an edge of the adjacent region and the first chucking region.

9. The apparatus of claim 1, wherein the surface of the adjacent region is above the surface of the first chucking region.

\* \* \* \* \*